United States Patent
Chen et al.

(10) Patent No.: US 8,710,504 B2
(45) Date of Patent: Apr. 29, 2014

(54) FLAT DISPLAY PANEL AND METHOD FOR FORMING THE SAME

(75) Inventors: Shyh-Feng Chen, Shenzhen (CN); Ming Hung Shih, Shenzhen (CN); Haiying He, Shenzhen (CN)

(73) Assignee: Shenzhen China Star Optoelectronics Technology Co., Ltd., Guangdong (CN)

( * ) Notice: Subject to any disclaimer, the term of this patent is extended or adjusted under 35 U.S.C. 154(b) by 113 days.

(21) Appl. No.: 13/380,881

(22) PCT Filed: Dec. 20, 2011

(86) PCT No.: PCT/CN2011/084269
§ 371 (c)(1),
(2), (4) Date: Dec. 26, 2011

(87) PCT Pub. No.: WO2013/091169
PCT Pub. Date: Jun. 27, 2013

(65) Prior Publication Data
US 2013/0153905 A1    Jun. 20, 2013

(30) Foreign Application Priority Data
Dec. 18, 2011  (CN) .......................... 201110427168.7

(51) Int. Cl.
*H01L 29/04* (2006.01)
*H01L 29/10* (2006.01)
*H01L 31/00* (2006.01)

(52) U.S. Cl.
USPC ............... 257/59; 257/72; 257/435; 438/149; 438/128

(58) Field of Classification Search
USPC .............. 257/59, 72, E31.122, E29.282, 435, 257/659; 438/149, 154, 128, 129
See application file for complete search history.

(56) References Cited

U.S. PATENT DOCUMENTS

| | | | |
|---|---|---|---|
| 6,297,862 B1 * | 10/2001 | Murade | 349/44 |
| 2010/0053482 A1 * | 3/2010 | Koike | 349/5 |
| 2011/0128280 A1 * | 6/2011 | Tseng et al. | 345/214 |

* cited by examiner

*Primary Examiner* — Thanh Y Tran

(57) ABSTRACT

The present invention proposes to a flat display panel and a method for forming the same. The flat display panel includes a plurality of rows of scan lines, a plurality of columns of data lines and a plurality of blocking lines which are parallel and overlapped to the data lines. The plurality of blocking lines are placed at one side of pixel electrodes one on one and made of the same metallic layer with the plurality of scan lines. Each blocking line made of the same metallic layer with the scan line is wider than a corresponding data line, so that light not blocked by the data line is blocked by the wider blocking line.

3 Claims, 4 Drawing Sheets

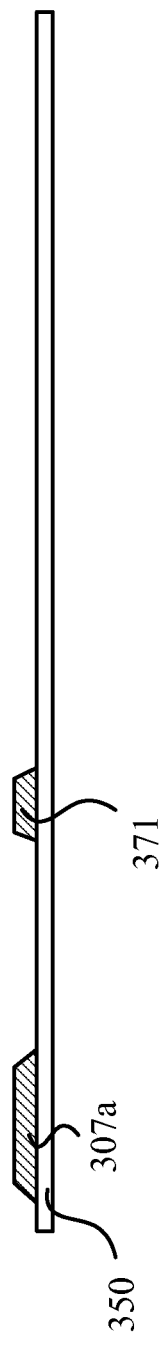
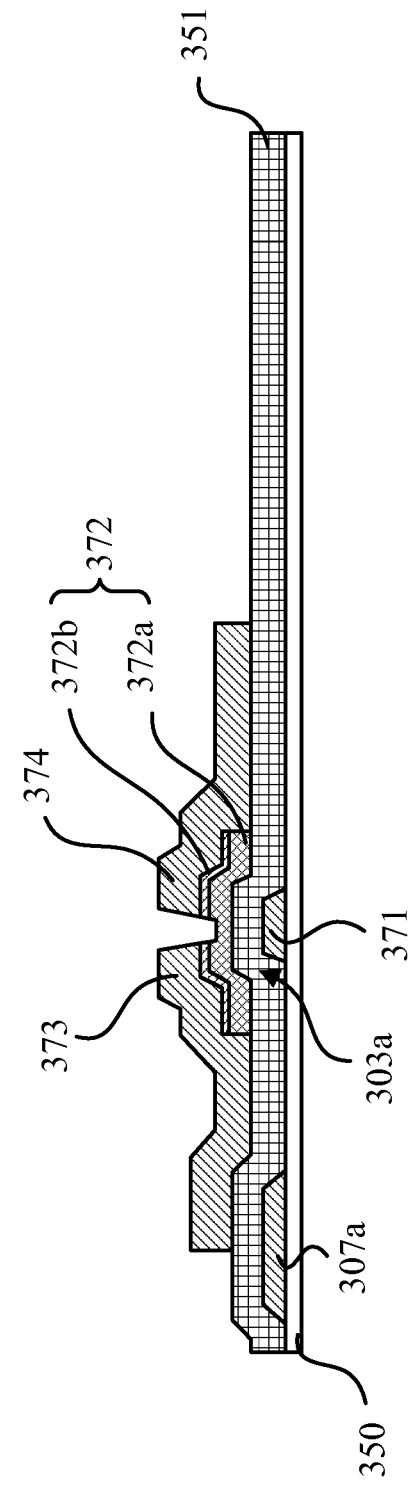

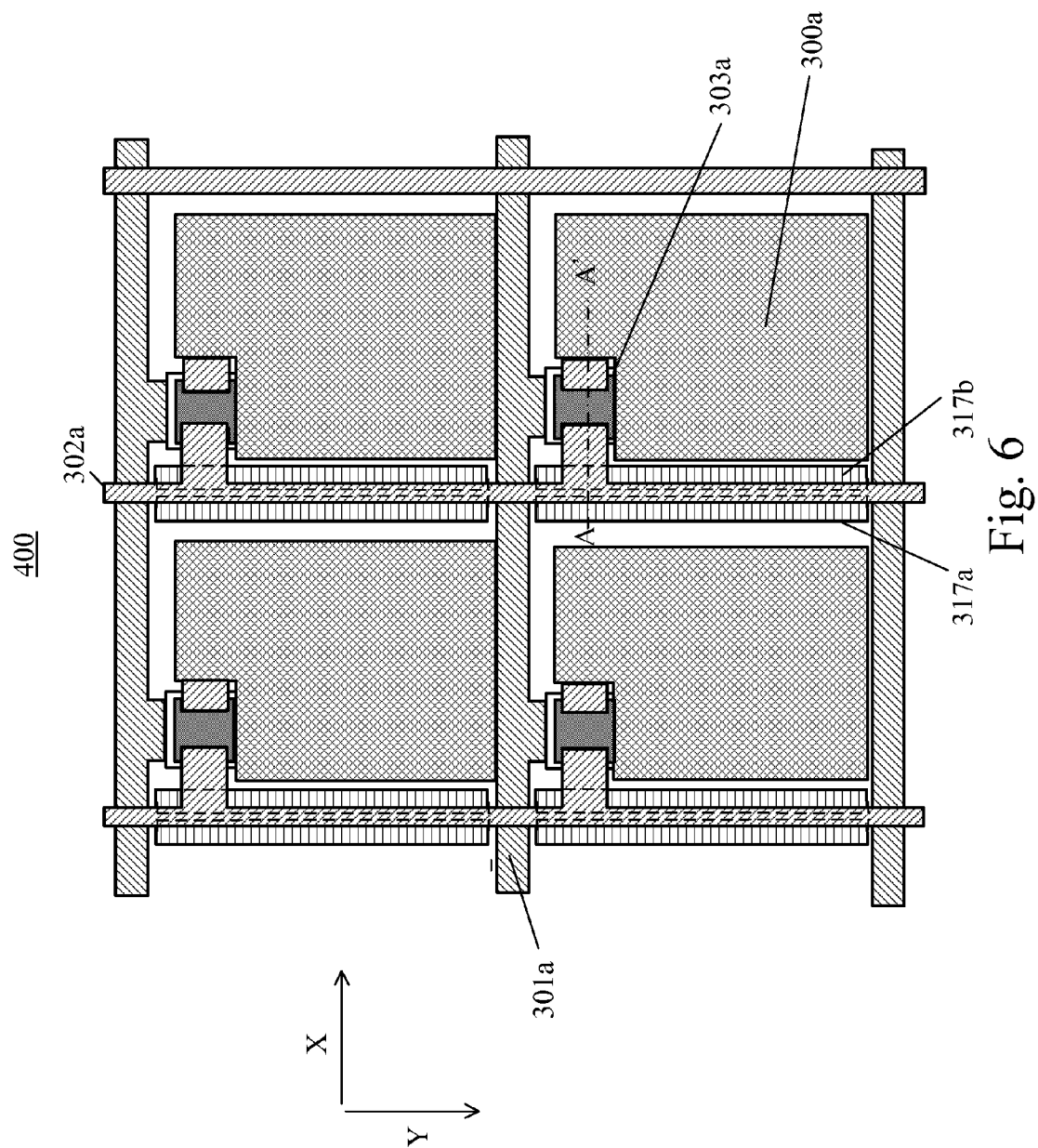

FLAT DISPLAY PANEL AND METHOD FOR FORMING THE SAME

BACKGROUND OF THE INVENTION

1. Field of the Invention

The present invention relates to a flat display panel and a method for forming the same, and more particularly, to a flat display panel comprising blocking lines and a method for forming the same.

2. Description of the Prior Art

A thin flat display is widely used in current consumer electronic products. Liquid crystal displays (LCDs) which are colorful monitors with high resolution are widely used in various electronic products such as monitors for mobile phones, personal digital assistants (PDAs), digital cameras, laptop computers, and notebook computers.

A thin-film transistor liquid crystal display (TFT-LCD) panel has gradually become a mainstream product in the consumer electronics market because it has many advantages, such as high quality, efficient utilization of space, low consumption power, and no radiation. In order to advance surface light intensity and utilization of light source of a LCD panel, it has to increase not only light transmittance of a LCD panel but also especially aperture rate of pixels. A conventional LCD panel comprises a color filter substrate, a thin film transistor array substrate, and a liquid crystal layer disposed therebetween. However, such LCD panel has a lower resolution and a lower aperture rate. In addition, misalignment easily happens when bonding the color filter substrate with the thin film transistor array substrate.

For increasing an aperture rate of a pixel, one approach is to improve accuracy of aligning the thin film transistor array substrate and the color filter substrate. Recently, integrating the color filter on the thin film transistor array substrate to form a color filter on array (COA) substrate or integrating a black matrix on the thin film transistor array substrate to form a black matrix on array (BOA) substrate are presented. The COA substrate or the BOA substrate is assembled to an opposite substrate with no color filter or black matrix. Then liquid crystal molecules are filled between the two substrates to form a LCD panel. It does not lead to misalignment because the color filter is only and directly formed on the thin transistor array substrate. However, adopting such structure needs more precision of forming the color filter on the thin transistor array substrate. A little misalignment reduces the aperture rate and yield rate, thereby increasing manufacturing cost.

SUMMARY OF THE INVENTION

It is therefore an object of the present invention is to provide a flat display panel comprising blocking lines and a method for forming the same. The flat display panel without needing a black matrix layer not only reduce cost but also have no trouble of misalignment of a color filter substrate and a thin film transistor array substrate.

According to the present invention, a flat display panel comprises: a plurality of matrix-arranged pixel electrodes; a plurality of scan lines in rows, parallel to one another and extended along a first direction, for transmitting scan signals; a plurality of data lines in columns, parallel to one another and extended along a second direction which is perpendicular to the first direction, for transmitting data signals; a plurality of thin-film transistors (TFTs), coupled to the plurality of pixel electrodes, the plurality of scan lines in rows, and the plurality of data lines in columns one on one, each of the plurality of TFTs for conducting the data signal from the coupled data line to the corresponding pixel electrode when receiving the scan signal from the coupled scan line; and a plurality of blocking lines, parallel to and overlapped with the plurality of data lines in columns, the plurality of blocking lines not connected to one another, the plurality of blocking lines and the plurality of scan lines in rows made of the same metallic layer.

In one aspect of the present invention, the flat display panel further comprises an insulating layer placed between the plurality of blocking lines and the plurality of data lines, and a passivation layer placed on the plurality of data lines.

In another aspect of the present invention, one of the plurality of blocking lines is placed at one side of each pixel electrode, and a width of each blocking line is broader than that of the data line which is overlapped with. In still another aspect of the present invention, two of the plurality of blocking lines are placed at one side of each pixel electrode, and the two blocking lines are partially overlapped with the data lines.

According to the present invention, a method of forming a flat display panel comprises the steps of: providing a glass substrate; forming a first metallic layer on the glass substrate; etching the first metallic layer to form gates of a plurality of TFTs, a plurality of blocking lines, and a plurality of scan lines, the plurality of blocking lines being not connected to one another; forming an insulating layer on the gates of the TFTs, on the blocking lines, and on the scan lines; forming a semiconductor layer and a second metallic layer on the insulating layer; and simultaneously etching the semiconductor layer and the second metallic layer to form channels, sources, and drains of the TFTs, and a plurality of data lines in columns which are parallel to and overlapped with the plurality of blocking lines.

In one aspect of the present invention, the method further comprises the steps of: forming a passivation layer on the data lines, the sources and the drains of the TFTs; etching the passivation layer to form a via on top of the drains; and forming a transparent conducting layer on the passivation layer and etching the transparent conducting layer to form a pixel electrode.

In another aspect of the present invention, a width of each blocking line is broader than that of the overlapped data line.

In still another aspect of the present invention, two of the plurality of blocking lines are placed at one side of each pixel electrodes and the two blocking lines are partially overlapped with the data lines.

According to the present invention, a method of forming a flat display panel comprises the steps of: providing a glass substrate; forming a first metallic layer on the glass substrate; etching the first metallic layer to form gates of a plurality of TFTs, a plurality of blocking lines, and a plurality of scan lines, the plurality of blocking lines being not connected to one another; forming an insulating layer on the gates of the TFTs, on the blocking lines, and on the scan lines;

forming a semiconductor layer on the insulating layer; etching the semiconductor layer, for forming channels of the TFTs; and forming and etching a second metallic layer to form sources and drains of the TFTs and a plurality of data lines, parallel to and overlapped with the plurality of data lines in columns. In contrast to prior art, the present invention provides a flat display panel having blocking lines and a method for forming the same. The flat display panel comprises a plurality of rows of scan lines, a plurality of columns of data lines, and a plurality of blocking lines which are parallel to and overlapped with the data lines. The plurality of blocking lines are placed at one side of pixel electrodes one on one and made of the same metallic layer with the plurality of scan lines. Because each blocking lines is broader than the overlapped data line, each blocking line is capable of blocking light which is not blocked by the corresponding data line. Since the blocking lines and the scan lines are simultaneously formed by etching the same metallic layer with the same mask, forming such flat display panel will not raise additional cost.

These and other features, aspects and advantages of the present disclosure will become understood with reference to the following description, appended claims and accompanying figures.

BRIEF DESCRIPTION OF THE DRAWINGS

FIGS. 2-5 illustrate schematic diagrams of forming the flat display panel in the present invention.

FIG. 6 shows a partial schematic diagram of a flat display panel comprising a blocking line structure according to a second embodiment of the present invention.

DETAILED DESCRIPTION OF THE PREFERRED EMBODIMENTS

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Figure 1:
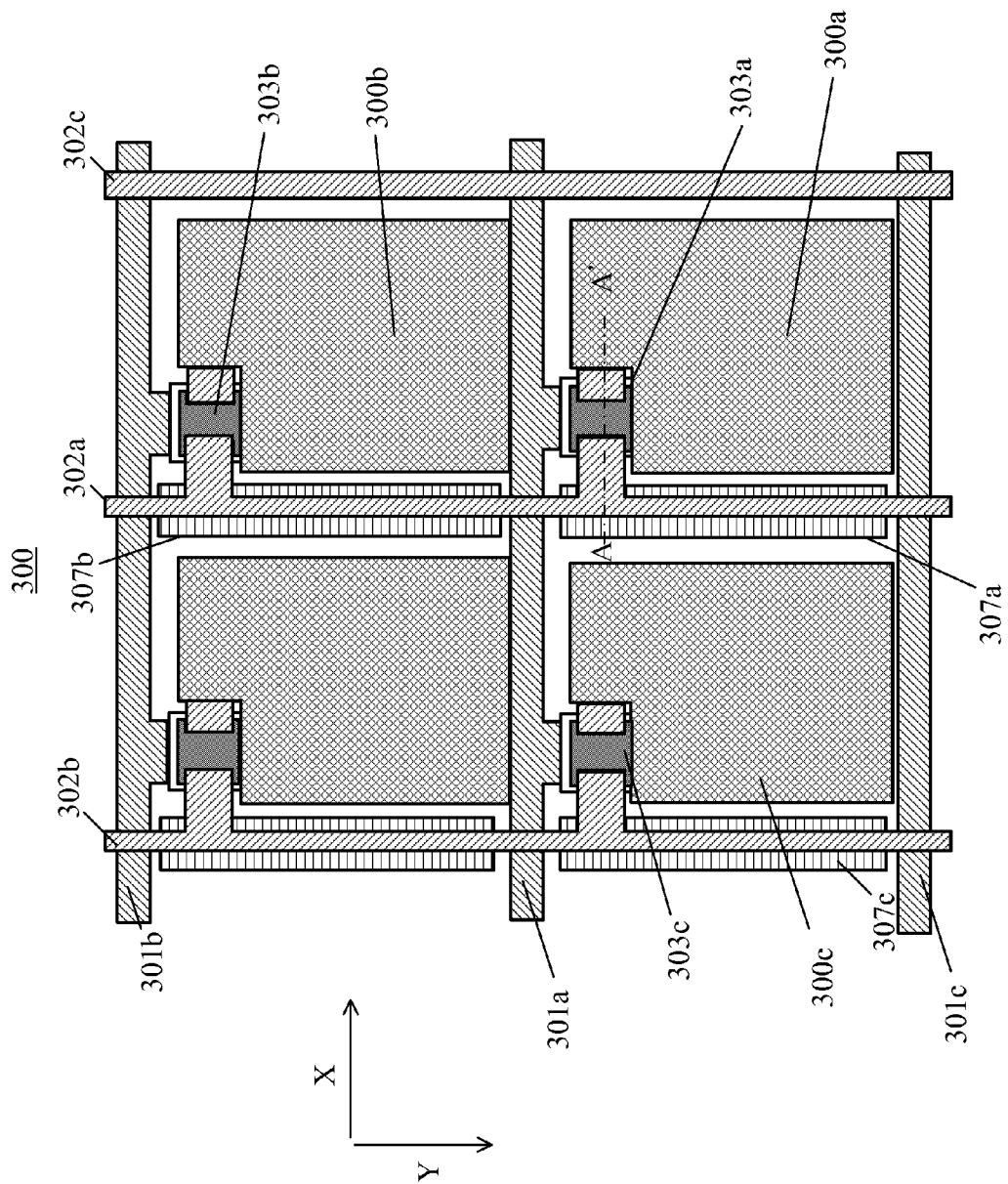
FIG. 1 shows a partial schematic diagram of a flat display panel comprising blocking lines according to a first embodiment of the present invention.

Refer to FIG. 1. FIG. 1 shows a partial schematic diagram of a flat display panel comprising blocking lines according to a first embodiment of the present invention. The flat display panel comprises a plurality of pixel electrodes, hundreds of scan lines, hundreds of data lines and blocking lines. For clarification and simplification, the flat display panel 300 is partially illustrated in the embodiment. The flat display panel 300 comprises a plurality of matrix-arranged pixel electrodes 300a, 300b and 300c, a plurality of scan lines 301a, 301b, and 301c parallel to one another and extended along a first direction X, a plurality of data lines 302a, 302b, and 302c parallel to one another and extended along a second direction Y, a plurality of TFTs 303a, 303b, and 303c, and a plurality of blocking lines 307a, 307b, and 307c parallel to the data line 302a. The second direction Y is perpendicular to the first direction X. The TFT 303a has a gate coupled to the scan line 301a, a source coupled to the data line 302a, and a drain coupled to the pixel electrode 300a. The structure and connecting relation of the TFTs 303b and 303c is the same as that of the TFT 303a, so no further details are released hereafter. When the TFT 303a receives a scan signal transmitted through the coupled scan line 301a, a data signal transmitted through the coupled data line 302a is transmitted to the corresponding pixel electrode 300a. LC molecules between the pixel electrode 300a and the common line 305 rotate to show different grayscales depending upon data voltage applied to the pixel electrode 300a.

In the process of forming a cell, a photo etching process (PEP) with a mask is conducted on a first metallic layer (not shown) to form a plurality of scan lines 301a, 301b, and 301c in rows, and a plurality of blocking lines 307a, 307b, and 307c simultaneously. The plurality of blocking lines 307a, 307b, and 307c are disposed on one side of the plurality of pixel electrodes 300a, 300b, and 300c one on one. Next, a PEP with another mask is conducted on a second metallic layer (not shown) to form a plurality of data lines 302a, 302b, and 302c in columns. At least one insulating layer (not shown) is placed between the first metallic layer which forms the plurality of scan lines 301a, 301b, and 301c, and the plurality of blocking lines 307a, 307b, and 307c, and the second metallic layer which forms the plurality of data lines 302a, 302b, and 302c. The insulating layer is used for preventing the plurality of scan lines, blocking lines, and data lines from being electrically connected directly. Preferably, blocking lines corresponding to a data line in the same column at one side of a plurality of pixel electrodes are overlapped with the data line. For example, the data line 302a is overlapped with the blocking lines 307a and 307b, and width of each blocking line 307a and 307b is broader than that of the overlapped data line 302a.

Generally speaking, a chance of leaking light for the data line 302a is larger than the scan line 301a because the width of the data line 302a is narrower than that of the scan line 301a. The width of the blocking lines 307a and 307b, however, is broader than that of the data line 302a, and the blocking lines 307a, 307b, and the scan line 301a and the blocking lines 307a and 307b are made of the same metallic layer as well. Therefore, the blocking lines 307a and 307b can block light which is not blocked by the overlapped data line 302a.

The method of forming the flat display panel 300 of the present invention will be disclosed as follows. FIGS. 2-5 illustrate schematic diagrams of forming the flat display panel 300 in the present invention.

Referring to FIG. 2, a glass substrate 350 serves as a lower substrate. A metallic thin-film deposition is conducted on the glass substrate 350 to form a first metallic layer (not shown) on the surface of the glass substrate 350. Also, a first PEP is conducted using a first mask to form the gate 371 of the TFT 303a, the blocking line 307a, and the scan line 301a. Even if the scan line 301a is not labelled in FIG. 2, as a person skilled in this art is aware, the gate 371 is a portion of the scan line 301a.

Referring to FIG. 3, an insulating layer 351 made of silicon nitride (SiNx) is deposited and covers the gate 371, the blocking line 307a, and the scan line 301a. An amorphous Si (a-Si) layer and an N+ a-Si layer at high electron doping concentrations are deposited on the insulating layer 351 successively. A semiconductor layer 372 is formed after a second PEP is conducted using a second mask. The semiconductor layer 372 comprises an a-Si layer 372a and an ohmic contact layer 372b. The a-Si layer 372a serves as a channel of the TFT 303a; the ohmic contact layer 372b is used for reducing resistance. The data line 302a is directly connected to the source 373. Even if the data line 302a is not labelled in FIG. 3, as a person skilled in this art is aware, the source 373 is a portion of the data line 302a.

In addition, in this embodiment, the a-Si layer, the N+ a-Si layer, and the second metallic layer are etched simultaneously by using the second mask to form the structure of FIG. 3. In another embodiment, the a-Si layer and the N+ a-Si layer are deposited on the insulating layer 351, and then are etched with the second mask to form the semiconductor layer 372. Afterwards, the second metallic layer is formed on the semiconductor layer 372 and on the insulating layer 351, and then is etched with another mask to form the source 373, the drain 374 of the TFT 303a and the data line 302a.

Figure 4:
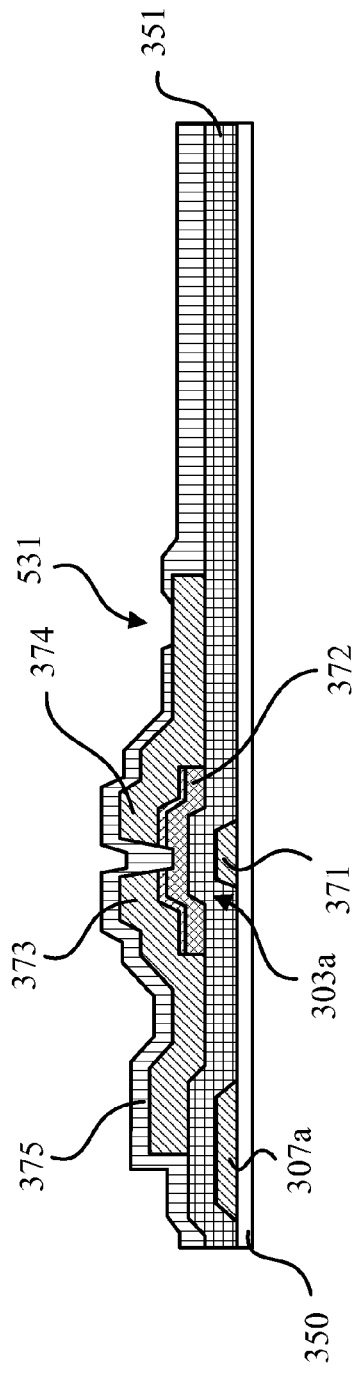

Referring to FIG. 4, a passivation layer 375 made of SiNx is deposited, covering the source 373, the drain 374, and the data line 302a. Next, a fourth PEP is conducted using a third mask to remove part of the passivation layer 375 on the drain 374 until the surface of the drain 374 is exposed. A via 531 is formed on the drain 374.

Figure 5:
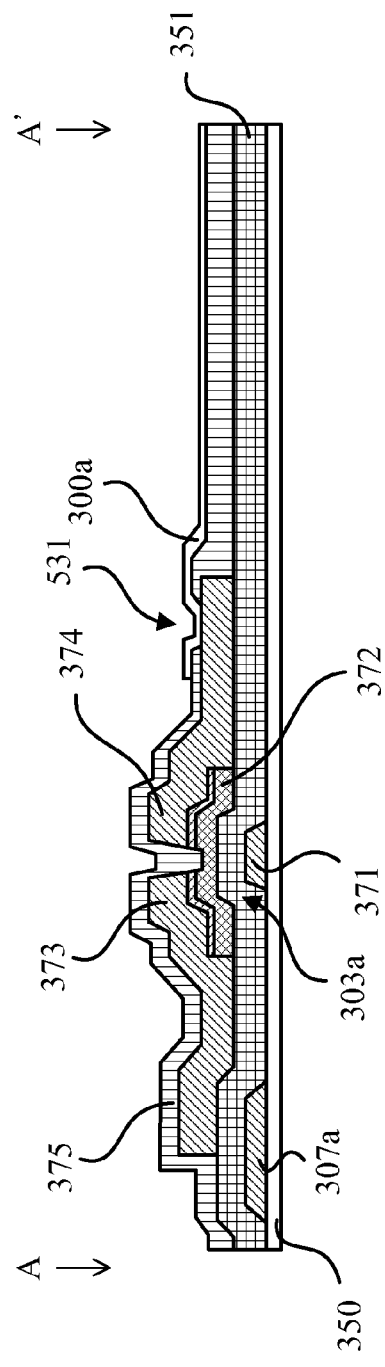

FIG. 5 is also a cross section view of the flat display panel 300 taken along line A-A' of FIG. 2. A transparent conducting layer made of indium tin oxide (ITO) is formed on the passivation layer 375. Next, the pixel electrode 300b is formed after the transparent conducting layer is etched using a fourth mask. The pixel electrode 300b is electrically connected to the drain 374 of the TFT 303a through the via 531 formed beforehand.

The flat display panel 300 is partially illustrated in the embodiment. A photo etching process (PEP) with a mask is conducted on a first metallic layer (not shown) to form a plurality of blocking lines 307a, 307b, and 307c and scan lines 301a, 301b, and 301c in the above-mentioned process, therefore, there is no need of additional process to form the plurality of blocking lines 307a, 307b, and 307c in the method of forming the flat display panel 300 in the present invention. Besides that, since the widths of the blocking lines 307a and 307b are broader than that of the data line 302a, the blocking lines 307a and 307b can block light which is not blocked by the overlapped data line 302a.

Refer to FIG. 6. FIG. 6 shows a partial schematic diagram of a flat display panel 400 comprising a blocking line structure according to a second embodiment of the present invention. The manufacturing processes of the flat display panel 300 in FIG. 1 and the flat display panel 400 in FIG. 6 are the same. Two blocking lines of the flat display panel 400 in FIG. 6 are placed at one side of each pixel electrode and are partially overlapped with the data lines. Such design is different to the flat display panel 300 in FIG. 1. For instance, two blocking lines 317a and 317b are placed at one side of the pixel electrode 300a in the flat display panel 400 and are partially overlapped with the data line 302a. The data line 302a is also capable of blocking light because it is made of metallic layer. Furthermore, the blocking lines 317a and 317b placed at both sides of the data line 302a enlarge blocking areas to block light which is similar to the flat display panel 300 in FIG. 1.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A flat display panel, comprising:
a plurality of pixel electrodes arranged in a matrix;
a plurality of scan lines in rows, parallel to one another and extended along a first direction, for transmitting scan signals;
a plurality of data lines in columns, parallel to one another and extended along a second direction which is perpendicular to the first direction, for transmitting data signals;
a plurality of thin-film transistors (TFTs), coupled to the plurality of pixel electrodes, the plurality of scan lines in rows, and the plurality of data lines in columns, the plurality of TFTs for conducting the data signals from the plurality of data lines to the plurality of pixel electrodes when receiving the scan signals from the plurality of d scan lines; and
a plurality of blocking lines, parallel to and overlapped with the plurality of data lines in columns, the plurality of blocking lines not connected to one another, the plurality of blocking lines and the plurality of scan lines in rows made of the same metallic layer,
wherein two of the plurality of blocking lines are placed at one side of each pixel electrode, and partially overlapped with the data lines.

2. The flat display panel of claim 1, further comprising an insulating layer placed between the plurality of blocking lines and the plurality of data lines, and a passivation layer placed on the plurality of data lines.

3. The flat display panel of claim 1, wherein one of the plurality of blocking lines is placed at one side of each pixel electrode, and a width of each blocking line is broader than that of the data line which is overlapped with.

* * * * *